(12) United States Patent
Bera

(10) Patent No.: US 6,839,749 B1
(45) Date of Patent: Jan. 4, 2005

(54) NETWORK REPRESENTATION AND MANIPULATION THEREOF

(75) Inventor: Rajendra Kumar Bera, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 1007 days.

(21) Appl. No.: 09/613,523

(22) Filed: Jul. 10, 2000

(51) Int. Cl.$^7$ .............................................. G06F 15/16
(52) U.S. Cl. ...................................... 709/223; 709/230
(58) Field of Search ................................ 709/245, 223, 709/224, 249, 230; 706/26, 27; 345/733, 734, 736; 703/21; 370/239, 242, 243, 244, 351, 392, 393, 394, 397, 395.31, 395.3, 254, 255, 256

(56) References Cited

U.S. PATENT DOCUMENTS

| | | | | |
|---|---|---|---|---|
| 5,392,220 A | * | 2/1995 | van den Hamer et al. | 716/2 |
| 6,310,883 B1 | * | 10/2001 | Mann et al. | 370/408 |
| 6,532,237 B1 | * | 3/2003 | Or et al. | 370/396 |
| 6,601,053 B1 | * | 7/2003 | Schaffer et al. | 706/26 |
| 6,608,635 B1 | * | 8/2003 | Mumm | 345/736 |
| 6,654,802 B1 | * | 11/2003 | Oliva et al. | 709/224 |
| 6,704,780 B1 | * | 3/2004 | Sethi | 709/223 |

* cited by examiner

Primary Examiner—William A. Cuchlinski, Jr.
Assistant Examiner—Joseph Maniwang
(74) Attorney, Agent, or Firm—Schmeiser, Olsen & Watts; William H. Steinberg

(57) ABSTRACT

A computer implemented method (200) is provided for representing a network in a canonical form. The network has nodes and arcs. Each arc has a source node and a destination node. Each node has an identifier, and optionally, one or more properties. Various manipulations that may be carried out on the network's canonical representation are also provided. Further, a computer implemented method is provided for determining the equivalence between two networks either on the basis of the nodes' identifiers or some specific property of the nodes. An apparatus (100) for performing the above method (200) is also provided.

68 Claims, 4 Drawing Sheets

NETWORK REPRESENTATION AND MANIPULATION THEREOF

TECHNICAL FIELD OF THE INVENTION

The present invention relates to networks generally, and in particular, to a manner of representation of such a network. The invention further relates to a method and apparatus for determining whether two networks are equivalent by utilizing the above manner of representation of networks.

Networks that fall within the purview of the present invention include, among others, computer, telecommunications (e.g. telephony, video and data), and power distribution types.

BACKGROUND ART

A network representation using nodes interconnected by arcs, provides a powerful visual and conceptual aid for portraying relationships between components of systems. Examples of such systems include an arithmetic expression where operators and operands are connected to each other, a railway system where stations are connected to each other, a telephone system where telephones and exchanges are connected to each other, an organisation where employees and activities are connected to each other through hierarchical and peer relationships, a computer system where computer hardware and software are connected to each other through various kinds of links, and a knowledge system where ideas and what can be done with the ideas are linked together.

The general convention of "node(s)" and "arc(s)" has been adapted herein to generally cover all network components and interconnections. The topologies of networks are important because similar topologies are expected to share generic properties and behaviour in a well-defined context. One may view the notion of topology in a way similar to human notions of shape (the object does not have sharp corners or the object is roughly a sphere or the object looks like a box, etc.). Topologies describe which kinds of nodes are connected to which other kinds of nodes.

A difficulty that often arises is deciding whether two networks are equivalent. This is especially problematic when each network uses a different set of names for its nodes. Two networks are said to be identical if each node of one can be placed upon an unoccupied node of the other in such a manner that the arcs (connectivities) of the two networks match. On the other hand, determining the topological equivalence or otherwise between two networks, using a representation having nodes interconnected by arcs, is comparatively simpler because the nomenclature is shared between the networks.

DISCLOSURE OF THE INVENTION

It is an object of the present invention to provide a manner of representation of a network.

According to a first aspect of the invention, there is provided a method of representing a network in a canonical form. The network has nodes and arcs, each node having an identifier, and each arc having a source node and in destination node. The method comprising the steps of:

(a) ordering a list of the node identifiers;

(b) creating a node string from the ordered list of node identifiers;

(c) determining one or both of a grouped outgoing arcs string and a grouped incoming arcs string; and (d) combining the node string with one or both of the grouped outgoing arcs string and the grouped incoming arcs string to form the canonical form representation of the network called the network string.

For a grouped outgoing arcs string, the determining step comprises the steps of:

(i) determining a list of destination node identifiers associated with each node identifier; and (ii) codifying the lists of destination node identifiers into a string.

For a grouped incoming arcs string, the determining step comprises the steps of:

(i) determining a list of source node identifiers associated with each node identifier; and (ii) codifying the lists of source node identifiers into a string.

The node identifiers are preferably unique for each node.

The step of codifying the grouped outgoing arcs string preferably comprises the steps of:

codifying, for each node identifier, a node outgoing arcs string from the list of destination node identifiers associated with that particular node identifier; and combining the node outgoing arcs strings.

The step of codifying said grouped incoming arcs string preferably comprises the steps of:

codifying for each node identifier, a node incoming arcs string from the list of source node identifiers associated with that particular node identifier; and combining the node incoming arcs strings.

The node string is preferably in the following form:

"$<n_0><n_1><n_2> \ldots <n_{r-1}>$"

wherein $n_i$ are the node identifiers.

The node outgoing arcs strings are preferably in the following form:

"$:<n_i><d_{i0}><d_{i1}> \ldots <d_{i,p-1}>$"

wherein $n_i$ is the particular node identifier, and $d_{ij}$ are the destination node identifiers having the node associated with the particular node identifier $n_i$ as a source node.

The node incoming arcs strings are preferably in the following form:

"$\%<n_i><s_{i0}><s_{i1}> \ldots <s_{i,q-1}>$"

wherein $n_i$ is the particular node identifier, and $s_{ik}$ are the source node identifiers having the node associated with the particular node identifier $n_i$ as a destination node.

According to a second aspect of the invention, there is provided a method of comparing networks. Each node has a unique identifier. The method comprising the steps of:

representing each network into a canonical form; and comparing the canonical forms of the networks, with identical canonical forms signifying identical networks.

According to a third aspect of the invention, there is provided a method of comparing network topologies of networks. Each node has a node property (represented as a string) as identifier. The method comprising the steps of:

representing each network into a canonical form; and comparing the canonical forms of the networks, with identical canonical forms signifying identical network topologies.

According to a fourth aspect of the invention, there is provided a network representation for representing a network in a canonical form, the network having nodes and arcs, each node having an identifier, and each arc having a source node and a destination node. The representation comprising:

a node string from an ordered list of the node identifiers;

one or both of a grouped outgoing arcs string and a grouped incoming arcs string, wherein the grouped outgoing arcs string comprises a list of destination node identifiers associated with each node identifier and the incoming arcs string comprises a list of source node identifiers associated with each node identifier.

According to a fifth aspect of the invention, there is provided an apparatus for representing a network in a canonical form. Each node has a unique identifier. The apparatus comprising:

(a) means for ordering a list of the node identifiers;

(b) means for creating a node string from the ordered list of node identifiers;

(c) means for determining one or both of a grouped outgoing arcs string and a grouped incoming arcs string; and (d) means for combining the node string with one or both of the grouped outgoing arcs string and the grouped incoming arcs string to form the canonical form representation of the network.

According to a sixth aspect of the invention, there is provided a computer program product carried by a storage medium for representing a network in a canonical form. The computer program product comprising:

(a) program element for ordering a list of the node identifiers;

(b) program element for creating a node string from the ordered list of node identifiers;

(c) program element for determining one or both of a grouped outgoing arcs string and a grouped incoming arcs string; and (d) program element for combining the node string with one or both of the grouped outgoing arcs string and the grouped incoming arcs string to form the canonical form representation of the network.

BRIEF DESCRIPTION OF THE DRAWINGS

A number of preferred embodiments of the present invention will now be described with reference to the drawings, in which.

DETAILED DESCRIPTION INCLUDING BEST MODE

Apparatus

Figure 1:
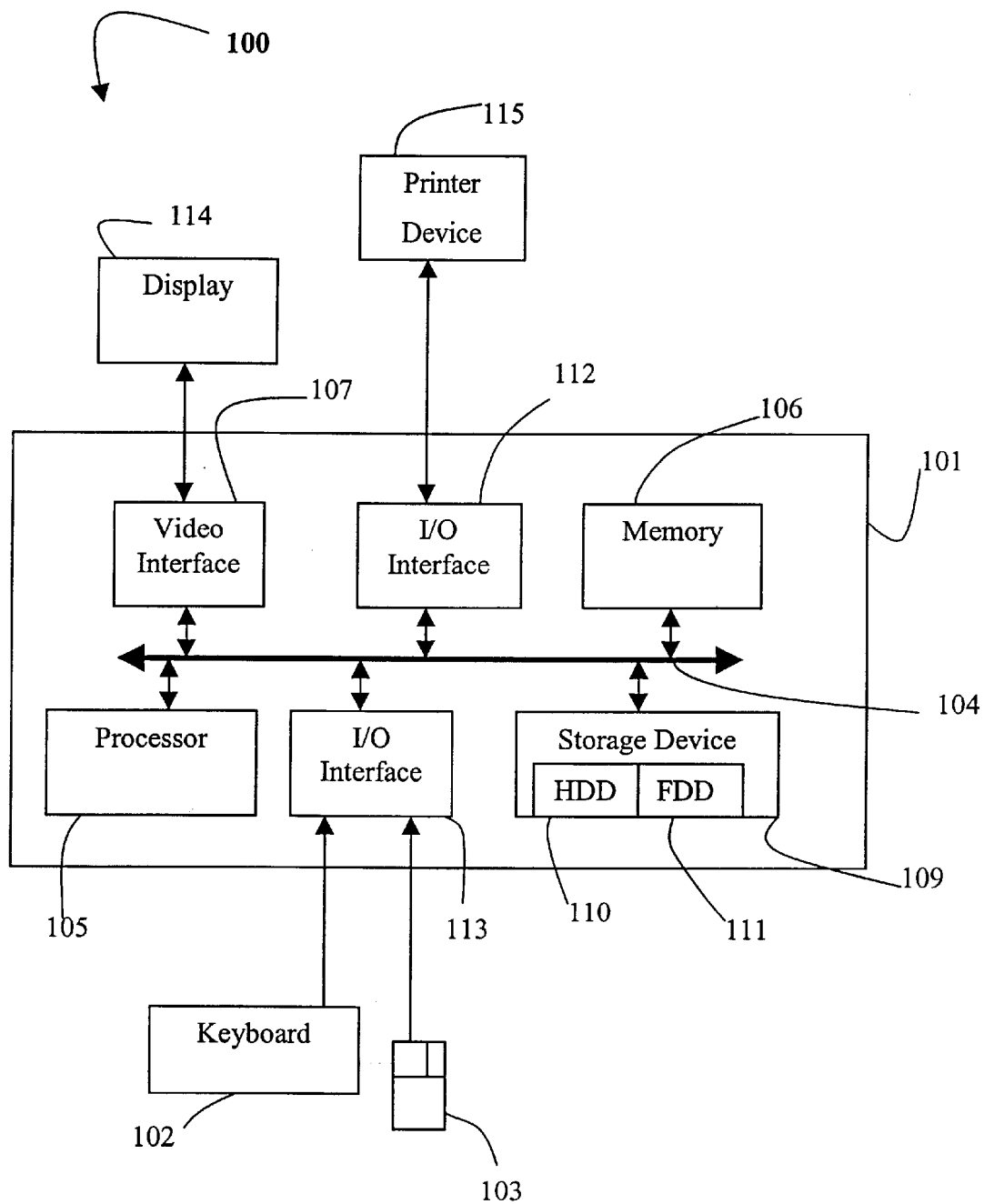
FIG. 1 is a schematic block diagram of a conventional general-purpose computer system upon which the embodiment of the invention may be practised.

A general-purpose computer system 100, upon which the preferred embodiment of the invention may be practised, is shown in FIG. 1. The computer system 100 will first be described, followed more particularly by a description of a method according to the preferred embodiment.

The invention can be implemented as software, such as an application program executing within the computer system 100. In particular, the steps of the method are effected by instructions in the software that are carried out by the computer system 100. The software may be stored in a computer readable medium, including the storage devices described below, for example. The software is loaded into the computer system 100 from the computer readable medium, and then executed by the computer system 100. A computer readable medium having such software or computer program recorded on it is a computer program product. The use of the computer program product in the computer preferably effects an advantageous apparatus for determining whether two networks are equivalent, in accordance with the embodiments of the invention.

The computer system 100 comprises a computer module 101, input devices such as a keyboard 102 and mouse 103, and output devices including a printer 115 and a display device 114. The computer module 101 typically includes at least one processor unit 105, a memory unit 106, for example formed from semiconductor random access memory (RAM) and read only memory (ROM), input/output (I/O) interfaces including a video interface 107, an I/O interface for the printer device 115 and an I/O interface 113 for the keyboard 102 and mouse 103. A storage device 109 is provided and typically includes a hard disk drive 110 and a floppy disk drive 111. A CD-ROM drive (not illustrated) may be provided as a non-volatile source of data. The components 105 to 113 of the computer module 101, typically communicate via an interconnected bus 104 and in a manner which results in a conventional mode of operation of the computer system 100 known to those in the relevant art.

Typically, the application program of the preferred embodiment is resident on the hard disk drive 110, and read and controlled in its execution by the processor 105. Intermediate storage of the program may be accomplished using the semiconductor memory 106, possibly in concert with the hard disk drive 110. In some instances, the application program may be supplied to the user encoded on a CD-ROM or floppy disk and read via a CD-ROM drive (not illustrated) or floppy disk drive 111, or alternatively may be read by the user from the network (not illustrated) via the modem device (not illustrated). Still further, the software can also be loaded into the computer system 100 from other computer readable medium including magnetic tape, a ROM or integrated circuit, a magneto-optical disk, a radio or infra-red transmission channel between the computer module 101 and another device, a computer readable card such as a PCMCIA card, and the Internet and Intranets including e-mail transmissions and information recorded on websites and the like. The foregoing is merely exemplary of relevant computer readable mediums. Other computer readable mediums may be practiced without departing from the scope and spirit of the invention.

In an alternative embodiment, the method of the invention may be practised as a distributed application, where operations within the method are distributed between two or more interconnected processors. These operations may be performed in parallel.

Having described the hardware environment of the invention, the methodology of a preferred embodiment will now be described.

Method of Writing a Network into its Canonical Form

Figure 3:
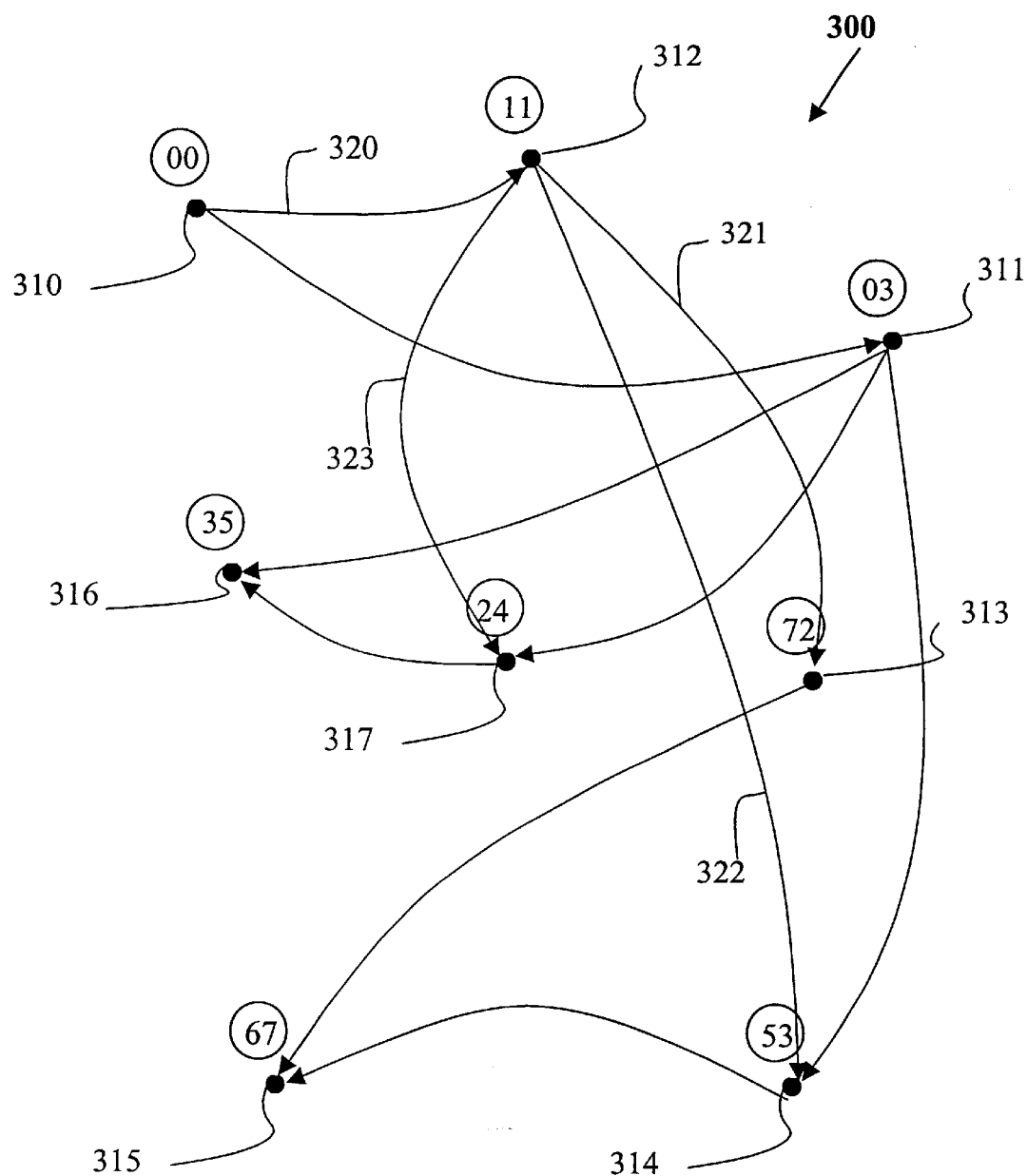
FIG. 3 illustrates an example of a first network.

Referring to FIG. 3 firstly, an example of a network 300 is shown. The network 300 includes a number of nodes 310–317. Each node 310–317 in the network 300 is given a unique node ID, expressed as a character string. The node IDs need not have the same string length. In the example network 300, the nodes 310–317 are given the node IDs 00, 03, 11, 72, 53, 67, 35, and 24 respectively.

The nodes 310–317 within the network 300 are interconnected via links. For the purpose of the analysis that follows, let an arc be defined as a link connecting a source ("from")

node and a destination ("to") node. For example, arc 320 connects node 310, being the source, to node 312, being the destination. Bi-directional links are represented as two links in opposite directions. Nodes 310–317 may be the source and/or destination of any number of arcs. For example, node 312, having node ID 11, is the source of arcs 321, 322 and 323, while being the destination of arc 320. Conversely, node 315 is not the source of any arcs.

Figure 2:
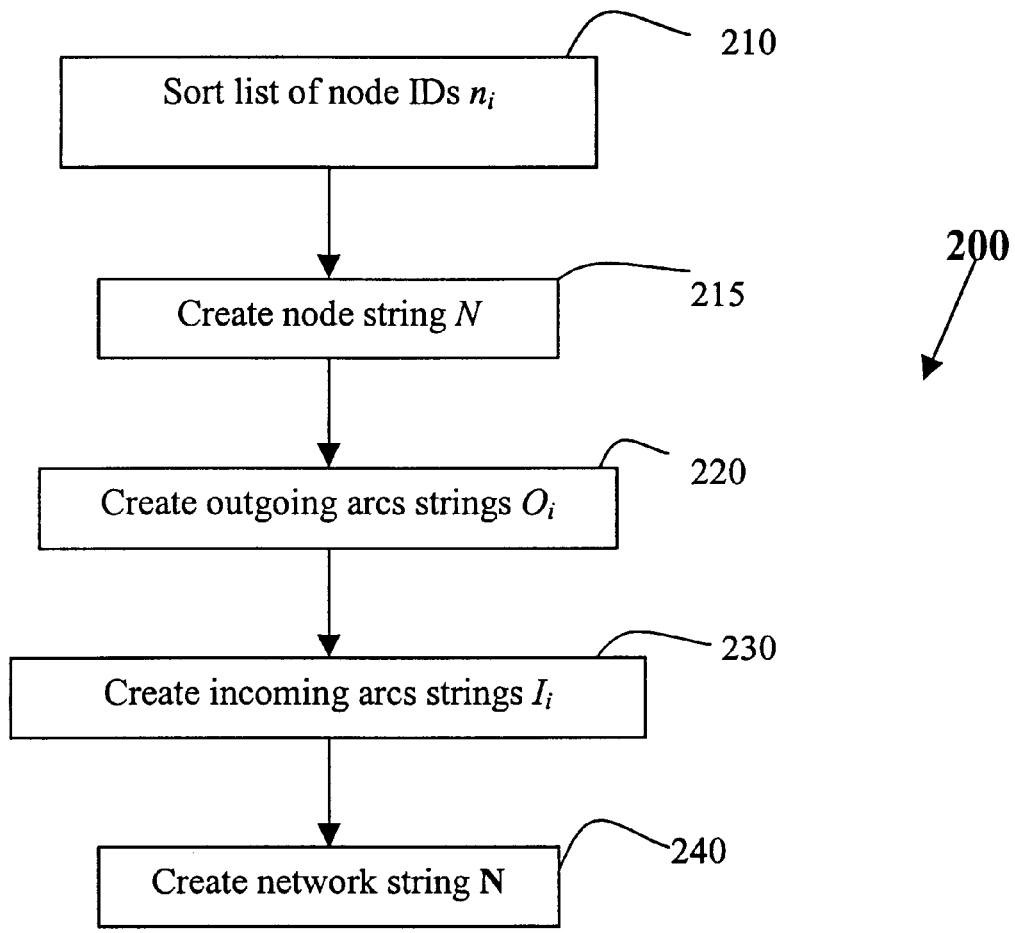
FIG. 2 is a flow diagram of a method of writing a network into its canonical form.

Referring now to FIG. 2, in which a method of writing a network in its canonical form is shown. For each network taken independently, in step 210 a list of node IDs is sorted in ascending (or descending) ASCII order. Let the sorted node ID list be N'={$n_0, n_1, \ldots, n_{r-1}$}, where $n_i$, with i=0, 1, ..., r−1 represent the distinct node IDs of the r nodes in the network. In step 215, the sorted node ID list N' is represented as a node character string N, where the first character of such a node string N is a blank, followed by the first node ID ($n_0$), followed by a blank followed by the second node ID ($n_1$) followed by a blank followed by the third node ID ($n_2$), etc. until the list N' is exhausted. The last character in the node string N will be a blank. That is, N="<$n_0$><$n_1$><$n_2$> ... <$n_{r-1}$>"

where <$n_i$> indicates that the actual character string for node ID $n_i$ is substituted when constructing the node string N.

Given a node ID $n_i$, and a sorted list of p distinct destination nodes $D_i$={$d_{i0}, d_{i1}, \ldots, d_{i,p-1}$} to which the node with node ID $n_i$ is linked to, an i-th outgoing arcs string is created for each node ID $n_i$ in step 220 as follows:

$O_i$=":<$n_i$><$d_{i0}$><$d_{i1}$> ... <$d_{i,p-1}$>".

The i-th outgoing arcs string $O_i$ begins with the special character ':', ends with a blank, and the node IDs $n_i$ and $d_{ij}$, with j=0, 1, ..., p−1, each of which must be in the sorted node ID list N∝, are separated from each other by a single blank. Any other character may be chosen as the special character, provided the character is neither a blank nor used in constructing any of the node IDs $n_i$. The special character ':' (call it the "source prefix") indicates that the node ID $n_i$ immediately following it is a source node. If a node ID $n_i$ does not have any destination node IDs $d_{ij}$, then its outgoing arcs string $O_i$ is a null string, that is, $O_i$="". Thus if there are r nodes in the network, there will at most be r non-null outgoing arcs strings. It follows that a sequence of strings {$O_0, O_1, \ldots, O_{r-1}$}, which are non-null, will be in sorted order because each non-null outgoing arcs strings $O_i$ begins with the sub-string ":<$n_i$>", and the node IDs $n_i$ are already in a sorted order, Likewise, given a node ID $n_i$, and a sorted list of q distinct source nodes $s_i$={($s_{i0}, s_{i1}, \ldots, s_{i,q-1}$} which link to the node with node ID $n_i$, step 230 creates an i-th incoming arcs string of each node ID $n_i$, as follows:

$I_i$="%<$n_i$><$s_{i0}$><$s_{i1}$> ... <$s_{i,q-1}$>".

The i-th incoming arcs string $I_i$ begins with the special character '%', ends with a blank, and the node IDs $n_i$ and $s_{ik}$, with k=0, 1, ..., q−1, each of which must be in the sorted node ID list N', are separated from each other by a single blank. Again any other character may be chosen as the special character, provided the character is neither a blank, nor the same as the source prefix, nor used in constructing any of the node IDs $n_i$. The special character '%' (call it the "destination prefix") indicates that the node I) $n_i$ immediately following it is a destination node. If a node ID $n_i$ does not have any source node IDs $s_o$, then its incoming arcs string $I_i$ is a null string, that is, $I_i$="". Thus, if there are r nodes in the network, there will at most be r non-null incoming arcs strings. It follows that the sequence of strings {$I_0, I_1, \ldots, I_{r-1}$}, which are non-null, will be in sorted order because each non-null incoming arcs string $I_i$ begins with the sub-string "%<$n_i$>", and the node IDs $n_i$ are already in sorted order.

The above methodology allows the entire network to be represented in step 240 as a network string N by concatenating the node string N, the outgoing arcs strings $O_0$, $O_1$, $O_2$, ..., $O_{r-1}$, and the incoming arcs strings $I_0, I_1, I_2, \ldots I_{r-1}$, that is:

N="<N><$O_0$><$O_1$><$O_2$> ... <$O_{r-1}$><$I_0$><$I_1$><$I_2$> ... <$I_{r-1}$>"

where each < ... > is to be replaced by its exact string representation. Thus, if any of the arcs strings $O_i$ and $I_j$ is null, it will automatically be excluded from appearing in the network string N. The above representation of a network by the network string N is the network's canonical representation, provided there is no node in the node string N which stands in isolation. For a connected network, there must be at least two nodes, and at least one each of outgoing arcs string $O_i$ and incoming arcs string $I_j$. For convenience of later reference, we use the notation A for a grouped arcs string, O for a grouped outgoing arcs string, and I for a grouped incoming arcs string, as defined below:

A="<$O_0$><$O_1$><$O_2$> ... <$O_{r-1}$><$I_0$><$I_1$><$I_2$> ... <$I_{r-1}$>"

O="<$O_0$><$O_1$><$O_2$> ... <$O_{r-1}$>"

I="<$I_0$><$I_1$><$I_2$> ... <$I_{r-1}$>"

so that

N="<N><A>"

A="<O><I>"

For a node with node ID $n_k$ to be in a network N, it is necessary that it be connected to at least one other node in the network N. That is, either the substring ":<$n_k$>" or the substring "%<$n_k$>" must be found in the grouped arcs string A. Further, a source-destination pair of connected nodes, ($n_k$, $n_l$), will be represented by an outgoing arcs string $O_k$ in the grouped arcs string A beginning with substring ":<$n_k$>" and will contain $n_l$ as a destination node in outgoing arcs string $O_k$. It will also have an incoming arcs string $I_l$ in the grouped arcs string A beginning with "%<$n_l$>" and will contain $n_k$ as a source node in the incoming arcs string $I_l$. A bidirectional arc connecting a node $n_k$ with another node $n_l$ will be treated as two separate arcs: one with $n_k$ as source and $n_l$ as destination, and the second with $n_l$ as source and $n_k$ as destination.

There exists redundancy in the information contained about the network links in the grouped outgoing arcs string O and the grouped incoming arcs string I. That is, I can be derived from O and vice-versa. However, both the grouped outgoing arcs string O and the grouped incoming arcs string I are kept in the network string N to facilitate the frequent searches of outgoing and incoming arcs that need to be made on the network string N, say by routing algorithms, etc. The redundancy can also be used to check on the consistency of the data stored in the network string N, when in doubt.

EXAMPLE OF WRITING A NETWORK IN ITS CANONICAL FORM

Let a network have a set of nodes with node IDs 00, 11, 03, 35, 24, 72, 67, 53, and arcs linking source-destination node pairs (00, 03), (00, 11), (03, 24), (03, 35), (03, 53), (11, 24), (11, 53), (11, 72), (24, 35), (72, 67), (53, 67). To create a network string N, a sorted node ID list N' is created by taking the set of node IDs and arranging them in an ascending order (step 210). Thus, the sorted node ID list is as follows:

N'={00, 03, 11, 24, 35, 53, 67, 72}.

Step 215 creates a node character string N from the sorted node ID list N' as follows:

N="<$n_0$><$n_1$><$n_2$> ... <$n_7$>"="00 03 11 24 35 53 67 72"

The arcs are considered next (step 220). For each node in node string N, destination nodes to which they are respectively linked are found. Thus for node $n_0$ its destination nodes (listed in ascending order) are:

$D_0 = \{d_{00}, d_{01}\} = \{03, 11\}$ obtained from the arcs $(n_0, d_{00}) = (00, 03)$ and $(n_0, d_{01}) = (00, 11)$. Likewise for the remaining nodes $n_1$ to $n_7$, the destination nodes are;

$D_1 = \{d_{10}, d_1, d_{12}\} = \{24, 35, 53\}$
$D_2 = \{d_{20}, d_{21}, d_{22}\} = \{24, 53, 72\}$
$D_3 = \{d_{30}\} = \{35\}$
$D_4 = \{\ \} = \{\ \}$
$D_5 = \{d_{50}\} = \{67\}$
$D_6 = \{\ \} = \{\ \}$
$D_7 = \{d_{70}\} = \{67\}$

From this, step 220 constructs the outgoing arcs strings $O_0$ to $O_7$ as follows:

$O_0$=":00 03 11"
$O_1$=":03 24 35 53"
$O_2$=":11 24 53 72"
$O_3$=":24 35"
$O_4$=" "
$O_5$=":53 67"
$O_7$=":72 67"

For step 230 to construct the incoming arcs strings $I_0$ to $I_7$, the source nodes are first found to be:

$s_0 = \{\ \} = \{\ \}$
$s_1 = \{s_{10}\} = \{00\}$
$s_2 = \{s_{20}\} = \{00\}$
$s_3 = \{s_{30}, s_{31}\} = \{03, 11\}$
$s_4 = \{s_{40}, s_{41}\} = \{03, 24\}$
$s_5 = \{s_{50}, s_{51}\} = \{03, 11\}$
$s_6 = \{s_{60}, s_{61}\} = \{53, 72\}$
$s_7 = \{s_{70}\} = \{11\}$

The incoming arcs strings are then as follows:

$I_0$=" "
$I_1$="%03 00"
$I_2$="%11 00"
$I_3$="%24 03 11"
$I_4$="%35 03 24"
$I_5$="%53 03 11"
$I_6$="%67 53 72"
$I_7$="%72 11"

For the network, step 240 creates the network string N as:
N="00 03 11 24 35 53 67 72 :00 03 11 :03 24 35 53 :11 24 53 72 :24 35 :53 67 :72 67%03 00%11 00%24 03 11%35 03 24 %53 03 11%67 53 72%72 11".

To verify if the network string N is in the canonical form, for each node ID $n_k$ in the node string N, it may be checked whether at least one of the substrings ":<$n_k$>" and "%<$n_k$>" exists in the network string N. If the check is confirmed for each node ID $n_k$, then the network string N is in the canonical form, otherwise not. In the example above, it is easily verified that the network string N is in the canonical form.

Operations on the Network String N and its Elements

The canonical form of the network makes its manipulation, and extraction of information from it straightforward, for example by using string and memory functions commonly found in function libraries of programming languages such as C and C++. These include the function libraries string.h and mem.h. By placing code for the operations listed below in such a function library, the analysis, design, and coding of network related software can be achieved. These operations include:

Pointers to Node String N, Grouped Arcs String A, Grouped Outgoing Arcs String O and Grouped Incoming Arcs String I The character pointer to, or address in memory of, the node string N is the same as the pointer to the network string N. The pointer to the grouped arcs string A is the pointer to the first source prefix character, ':', in the network string N. The pointer to the grouped arcs string A is also the pointer to the grouped outgoing arcs string O. The pointer to the grouped incoming arcs string I is the pointer to the first destination prefix character, '%', in the network string N. The respective pointers to the strings A, O and I can be obtained by using the strchr ( ) function available in C and C++. For example, the pointer to the grouped arcs string A is the pointer returned by calling the function strchr (N, (int)':').

Isolating Node String N, Grouped Arcs String A, Grouped Outgoing Arcs String O and Grouped Incoming Arcs String I In-Situ The strings N, A, O and I each form a substring of the network string N. Therefore, when a need arises to carry out a search on one of the substrings, the required substring will need to be isolated inside the network string N. For example, we may wish to know if a particular node is a destination node of another node specifically in O or in I.

If the node string N is to be isolated temporarily in-situ from the network string N, then the source prefix character ':' residing at the pointer to the grouped arcs string A (which is the same as the pointer to the grouped outgoing arcs string O) can be replaced temporarily with the '/0' (null) character. The pointer to the node string N will then represent only the substring N of the network string N. The operation is reversed when the node string N no longer needs to be isolated.

Similarly, if the grouped outgoing arcs string O is to be isolated in-situ from the network string N, then the destination prefix character '%' residing at the pointer to the grouped incoming arcs string I can be replaced temporarily with the '/0' (null) character. The pointer to grouped outgoing arcs string O will then represent only the substring O. The operation is reversed when the grouped outgoing arcs string O no longer needs to be isolated.

The grouped arcs string A can be isolated by simply pointing to it. Likewise, the grouped incoming arcs string I can be isolated by simply pointing to it.

Finding a Node

Let $n_k$ be the node ID of the node to be found. Finding the node may be performed by constructing the substring "<$n_k$>" and by carrying out a string search in the desired part of the network string N. The search may be performed by using the strstr ( ) function in C or C++. A non-null pointer returned by the function strstr ( . . . , "<$n_k$>") will point to the instance of the node with node ID $n_k$ that was found. Alternatively, the return of a null pointer will mean that a node with node ID $n_k$ was not found.

Finding Common Nodes

To find the common nodes between two given sets of nodes, the set with the least number of nodes is designated as set 1, whereas the other set is designated as set 2. In a case where the sets have an equal number of nodes, it is immaterial which set is designated as set 1 and which is designated as set 2. Then, for each node ID in set 1, it is determined whether it also exists in set 2. The node IDs of set 1, which are found in set 2, represent the common nodes to the two sets.

Finding the Outgoing Arcs String of a Node

To find the outgoing arcs string $O_k$ of the node with node ID $n_k$, the substring ":<$n_k$>" is constructed and a string search on the grouped outgoing arcs string O of network string N is carried out for this substring. This may be done by using the strstr (O, ":<$n_k$>") function in C or C++. A non-null pointer returned by the strstr ( ) function will point to the beginning of the outgoing arcs string $O_k$. This arcs string $O_k$ can be temporarily isolated from the network string N, if desired, by replacing the first following ':' or '%' character, whichever appears earlier, with the '/0' (null) character. A null pointer returned by the function strstr ( ) indicates that the outgoing arcs string $O_k$ does not exist.

Finding the Incoming Arcs String of a Node

Similarly, to find the incoming arcs string $I_k$ of the node with node ID $n_k$, the substring "%<$n_k$>" is constructed and a string search on the grouped incoming arcs string I of the network string N is carried out for this substring. Again, the strstr (I, "%<$n_k$>") function in C or C++ may be used. A non-null pointer returned by the strstr ( ) function will point to the beginning of the incoming arcs string $I_k$ and this arcs string can be temporarily isolated from the network string N, if desired, by replacing the first following '%' or '/0' character, whichever appears earlier, with the '/0' (null) character. A null pointer returned by the function strstr ( ) indicates that the incoming arcs string $I_k$ does not exist.

Finding an Outgoing Arc

Let the arc be given by the ordered source-destination nodes pair ($n_k$, $n_l$). If the outgoing arcs string $O_k$ of the node $n_l$ is found and if the node no is found in the outgoing arcs string $O_k$ then the arc has been found, otherwise not.

Finding an Incoming Arc

Let the arc be given by the ordered source-destination nodes pair ($n_l$, $n_k$). If the incoming arcs string $I_k$ of the node $n_k$ is found and if the node $n_l$ is found in the incoming arcs string $I_k$ then the arc has been found, otherwise not.

Deleting an Arc

Let the arc be given by the ordered source-destination nodes pair ($n_k$, $n_l$). If the arc exists, then there will be an outgoing arcs string $O_k$ containing $n_l$ as a destination node, and an incoming arcs string $I_l$ containing $n_k$ as a source node.

To delete the arc, the outgoing arcs string $O_k$ is found and the node ID $n_l$ is deleted from it. If the deletion results in the outgoing arcs string $O_k$ becoming devoid of destination nodes, then the outgoing arcs string $O_k$ is deleted from the network string N. Also, the incoming arcs string $I_l$ is found and the node ID $n_k$ is deleted from it. Again, if the deletion results in the incoming arcs string $I_l$ becoming devoid of source nodes, then the incoming arcs string $I_l$ is deleted from the network string N. If any of these steps cannot be carried out, then the delete arc operation is unsuccessful.

If the arc was deleted, then to ensure that the network string N stays in the canonical form, it is checked whether instances of the substrings "<$n_k$>", ":<$n_k$>" and "%<$n_k$>" can be found in the grouped arcs string A. If no instances of any of these substrings are found, then the node ID $n_k$ is deleted from the node string N. Likewise, if no instances of the substrings "<$n_l$>",":<$n_l$>" and "%<$n_l$>" are found in the grouped arcs string A, then the node ID $n_l$ is deleted from the node string N. This ensures that stand alone nodes, if created by the delete arc operation, will be eliminated from the network string N.

Deleting a Node from the Network

Deleting a node with node ID $n_k$ from the network means deleting, from the network string N, all instances of the substrings "<$n_k$>", deleting the two arcs strings $O_k$ and $I_k$, and finally deleting those outgoing arcs strings $O_l$ which have become devoid of destination nodes and those incoming arcs strings $I_m$ which have become devoid of source nodes. Since these operations may result in some of the nodes in the network string N becoming isolated, a check now needs to be made to find such nodes and delete them from the node string N. A node with node ID $n_j$ is deleted from the node string N if both substrings ":<$n_j$>" and "%<$n_j$>" are absent in the grouped arcs string A. Substring deletions may be effected by the memmove ( ) function in C and C++.

Inserting a Node

To insert a node with node ID $n_k$, it is firstly checked whether the node ID $n_k$ is found in the node string N of the network string N. If the node ID $n_k$ is not found, then the substring "<$n_k$>" (or "<$n_k$>") is inserted into the node string N at its proper sorted location. Substring insertions may be effected by the memmove ( ) and the memcpy( ) functions in C and C++.

Inserting an Arc

Let the arc to be inserted be given by the ordered source-destination nodes pair ($n_k$, $n_l$). This arc must be inserted into the outgoing arcs string $O_k$ and the incoming arcs string $I_l$.

The outgoing arcs string $O_k$ is found and the substring "<$n_l$>" is inserted into it, if it does not already exist, at its proper sorted location in its destination nodes $D_k$. If the outgoing arcs string $O_k$ is not found, then an outgoing arcs string ":<$n_k$><$n_l$>" is created and this string is inserted at its proper sorted location in the grouped outgoing arcs string O of the network string N.

Likewise, the incoming arcs string $I_l$ is found and the substring "<$n_k$>" is inserted into it, if it does not already exist, at its proper sorted location in its source nodes $s_l$. If the incoming arcs string $I_l$ is not found, then an incoming arcs string "%<$n_l$><$n_k$>" is created and this string is inserted at its proper sorted location in the grouped incoming arcs string I of the network string N.

If the arc has been inserted, and if node with node ID $n_k$ does not exist in the node string N, then the node ID $n_k$ is inserted into the node string N. Likewise, if node ID $n_l$ does not exist in the node string N, then the node ID $n_l$ is insert in the node string N.

Deleting a Subnetwork

Let the string representation of the subnetwork N, be in the same format as that of a network N, that is, a nodes string $N_s$, followed by one or more outgoing arcs strings $O_{ks}$, in turn, followed by one or more incoming arcs strings $I_{ls}$. For each arcs string $O_{ks}$ and $I_{ls}$ in the subnetwork, the following steps are performed:

(1) Prepare the list of arcs that the arcs string contains;
(2) For each arc in the list, delete the arc from the network string N, if found, else give an error message; and
(3) If step 2 did not cause any error messages, then for each node $n_k$ in the node string N of the network string N, determine whether at least one instance of one of the substrings ":<$n_k$>", "%<$n_k$>" or "<$n_k$>" exists in the grouped arcs string A of the network string N. If no instances of these substrings exist, then the node ID $n_k$ is deleted from the node string N to bring the network string N to its canonical form.

Inserting a Subnetwork

Let the string representation of the subnetwork $N_s$ be in the same format as that of a network N, that is, a nodes string $N_s$, followed by one or more outgoing arcs strings $O_{ks}$, in turn, followed by one or more incoming arcs strings $I_{ls}$. To insert the subnetwork, the following steps are performed:

(1) If the subnetnetwork has node IDs not present in the network string N, insert those nodes IDs in sorted order in the node string N.
(2) Prepare the list of arcs the subnetwork contains.
(3) For each arc in the list, insert the arc into the network string N, if not already found in the network string N.

Determining Whether a Subnetwork is in a Network

This is done by inserting the subnetwork into the network string N of the network. If the network string N remains unchanged, then the subnetwork is in the network.

Comparing Networks

Given two networks with network strings $N_1$ and $N_2$, if their canonical string representations are identical then the two networks are identical, otherwise not. For example, if the C function strcmp ($N_1$, $N_2$) returns the value 0 then the networks are identical, otherwise not.

Comparing Network Topology

If the desired comparison is to determine whether two given networks $N_1$ and $N_2$ are topologically identical, on the basis of some node property, say, node type rather than on the basis of node ID, then a network property string $\underline{N}_j$ is created for each network from the respective network strings $N_i$, by replacing the node IDs by their respective node property. The relationship between the network string N and the network property string $\underline{N}$ is $N$="$<N><O_0><O_1><O_2>$ . . . $<O_{r-1}><I_0><I_1><I_2>$ . . . $<I_{r-1}>$"

$\underline{N}$="$<\underline{N}><\underline{O}_0><\underline{O}_1><\underline{O}_2>$ . . . $<\underline{O}_{r-1}><\underline{I}_0><\underline{I}_1><\underline{I}_2>$ . . . $<\underline{I}_{r-1}>$"

where the underscore is used to signify that instead of node IDs $n_k$, node properties $\underline{n}_k$ have been used. Note that the character strings representing the properties $\underline{n}_k$ may not contain a blank, a source prefix ':', a destination prefix '%', or be a null string " ".

The node properties $\underline{n}_k$ may be the name or label used to designate the node. The equipment type of the node, such as PC, server, mainframe, etc. may also be used as the node property $\underline{n}_k$. Other commonly used properties include processor speed, memory capacity, functionality (e.g., mail server, back-up server, client, etc.) and ownership.

For example, given two computer systems and their respective architectures in the form of network representations where the nodes represent pieces of hardware and the arcs represent the connectivities between the different pieces. The original networks could have the hardware identified, say, by using part numbers as node IDs. Whether the two computer systems have the same architecture (topology) or not can be determined by replacing the part numbers by the functions they perform, such as, CPU, printer, scanner, monitor, etc. in the network representation as node properties $\underline{n}_k$ and using method 200.

To determine whether networks $N_1$ and $N_2$ are topologically identical, it is first determined whether the string lengths of the network property strings $\underline{N}_1$ and $\underline{N}_2$ are identical. If they are not, then the networks $\underline{N}_1$ and $\underline{N}_2$ can not be identical. Otherwise, for each network property string $\underline{N}$, the property lists $\underline{N}$, $\underline{D}_j$, and $\underline{S}_j$ are sorted in ascending (or descending) order, and then the outgoing arcs strings $\underline{O}$, and the incoming arcs strings $\underline{I}$ are sorted in ascending (or descending) order. The network property strings $\underline{N}_1$ and $\underline{N}_2$ are then reconstituted, with the sorted entities in the form $\underline{N}$="$<\underline{N}><\underline{O}><\underline{I}>$"

If the sorted network property strings $\underline{N}_1$ and $\underline{N}_2$ match using a string comparison, then the two networks are topologically identical on the particular node property selected, otherwise not.

EXAMPLE OF COMPARING NETWORK TOPOLOGY (EQUIVALENCE) OF TWO NETWORKS

Let a network 1 have the set of nodes with node IDs 00, 11, 03, 35, 24, 72, 67, 53, and a set of arcs linking source-destination node pairs (00, 03), (00, 11), (03, 24), (03, 35), (03, 53), (11, 24), (11, 53), (11, 72), (24, 35), (72, 67), (53, 67). This first network corresponds to the network 300 illustrated in FIG. 3.

Figure 4:
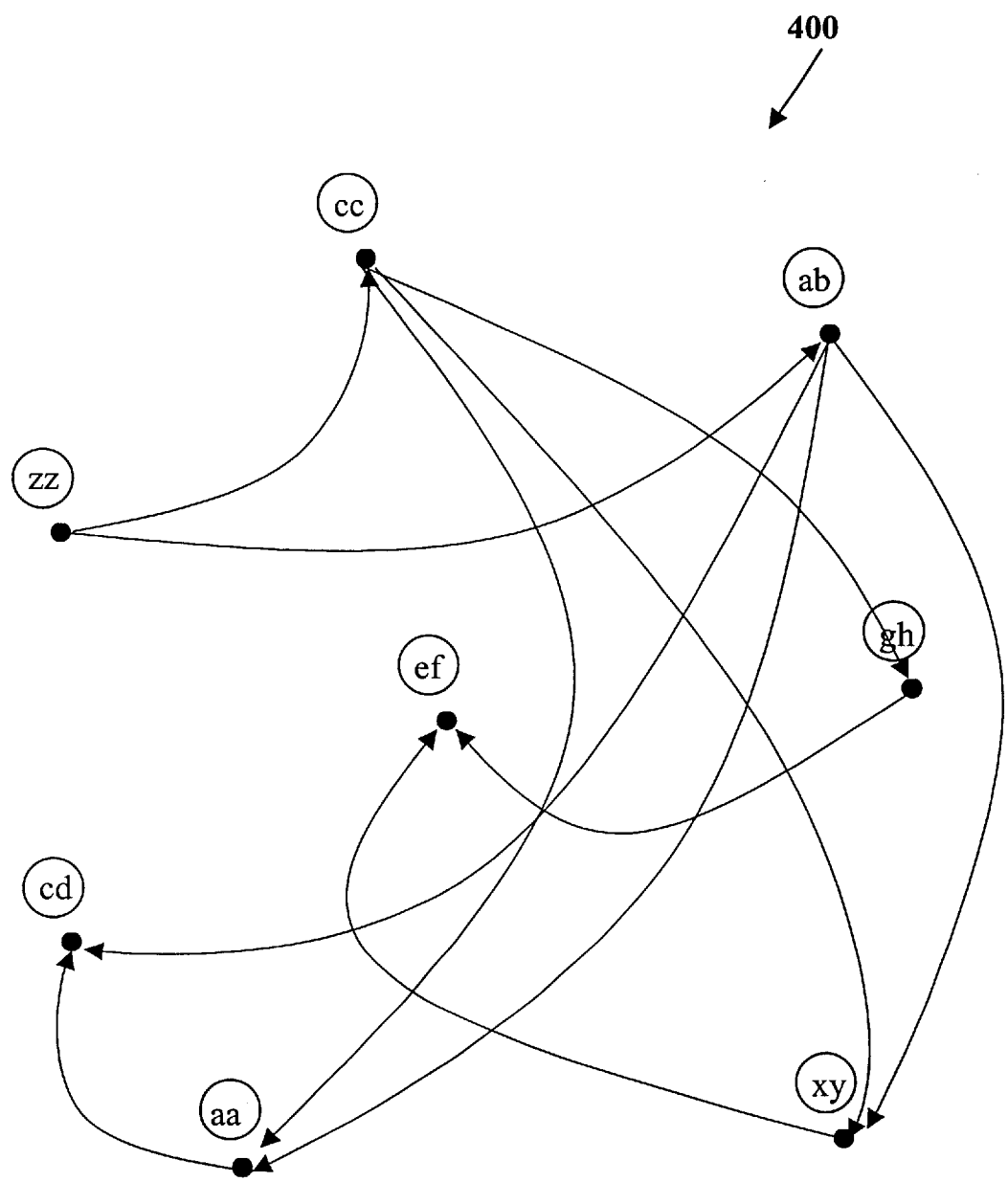
FIG. 4 illustrates example of a second network.

Likewise, let network 2 have the set of nodes with node IDs zz, cc, ab, cd, aa, gh, ef, xy, and a set of arcs linking source-destination node pairs (zz, ab), (zz, cc), (ab, aa), (ab, cd), (ab, xy), (cc, aa), (cc, xy), (cc, gh), (aa, cd), (gh, ef), (xy, ef). This second network 400 is illustrated in FIG. 4.

The network string $N_1$ was already created in the previous example, and is as follows:

$N_1$="00 03 11 24 35 53 67 72 :00 03 11 :03 24 35 53 :11 24 53 72 :24 35 :53 67 :72 67%03 00%11 00%24 03 11%35 03 24%53 03 11%67 53 72%72 11".

In a similar manner, following the method 200, the network string $N_2$ for the second network is written as:

$N_2$="aa ab cc cd ef gh xy zz :aa cd :ab aa cd xy :cc aa gh xy :gh ef :xy ef :zz ab cc %aa ab cc %ab zz %cc zz %cd aa ab %ef gh xy %gh cc %xy ab cc".

Since the naming convention of node IDs in the two networks are different, their network strings $N_1$ and $N_2$ will not match even if the two networks were identical otherwise.

Now let the ordered pair ($n_k$, $\underline{n}_k$) represent the node ID $n_k$ and its property $\underline{n}_k$. For network 1, let these pairs be (00, L), (03, M), (11, A), (24, M), (35, L), (53, A), (67, M), (72, L), and for network 2, let the pairs be (aa, M), (ab, M), (cc, A), (cd, L), (ef, M), (gh, L), (xy, A), (zz, L). Here A, L, and M are values the node property $\underline{n}_k$ may have.

A string for network 1, obtained by just substituting each node ID $n_k$ by its corresponding property $\underline{n}_k$ results in the string:

"L M A M L A M L :L M A :M M L A :A M A L :M L :A M :L M %M L %A L %M M A %L M M %A M A %M A L %L A".

From this string, when its $\underline{N}$, $\underline{O}$ and $\underline{I}$ parts are appropriately sorted, we get;

$\underline{N}$="A A L L L M M M"
$\underline{O}$=":A A L M :A M :L A M :L M :M A L M :M L"
$\underline{I}$="%A A M %A L %L A %L M M %M A L %M A M %M L"

and the network string $\underline{N}_1$ is:

"A A L L L M M M :A A L M :A M :L A M :L M :M A L M :M L %A A M %A L %L A %L M M %M A L %M A M %M L"

Likewise the string for network 2, obtained by just substituting each node ID $n_k$ by its corresponding property $\underline{n}_k$ results in the string:

"M M A L M L A L :M L :M M L A :A M L A :L M :A M :L M A %M M A %M L %A L %L M M %M L A %L A %A M A".

From this string, when its $\underline{N}$, $\underline{O}$ and $\underline{I}$ parts are appropriately sorted, we get:

$\underline{N}$="A A L L L M M M"
$\underline{O}$=":A A L M :A M :L A M :L M :M A L M :M L"
$\underline{I}$="%A A M %A L %L A %L M M %M A L %M A M %M L"

and the network string $\underline{N}_2$ is the string:

"A A L L L M M M :A A L M :A M :L A M :L M :M A L M NM L %A A M %A L %L A %L M M %M A L %M A M %M L"

By performing a string comparison between network strings $\underline{N}_1$ and $\underline{N}_7$, it is clear that the two networks are topologically equivalent since the networks produce identical network strings $\underline{N}_1$ and $\underline{N}_2$. This may appear surprising upon a purely visual inspection comparing the networks 300, 400 of FIGS. 3 and 4.

Three or more networks may be compared in a similar manner, by representing each network in its canonical form, and then performing string comparisons between pairs of network strings $\underline{N}_k$ and $\underline{N}_j$.

The network representation and its operations provided allow the topological equivalence problem to be solved with conceptual ease. Furthermore, the permitted manipulations on the network representation can be done through very simple coding instructions, by using string and memory functions provided in C and C++ function libraries. It is noted that data structures and efficient data manipulation are closely connected.

The network representation provided is conceptually very simple and has most frequently required information on the network coded in an ordered way. String and memory manipulation functions are used for find, replace, delete, etc. operations.

The foregoing describes only one embodiment of the present invention, and modifications and/or changes can be made thereto without departing from the scope and spirit of the invention, the embodiment being illustrative and not restrictive. For example, the equivalence of more than two networks may be determined by pair-wise comparisons of the networks for equivalence.

I claim:

1. A method of representing a network in a canonical form, said network having nodes and arcs, each node having an identifier, and each arc having a source node and a destination node, said method comprising the steps of:
   (a) ordering a list of said node identifiers;
   (b) creating a node string from said ordered list of node identifiers;
   (c) determining one or both of a grouped outgoing arcs string and a grouped incoming arcs string;
   wherein, for a said grouped outgoing arcs string, said determining step comprises the steps of:
      (i) determining a list of destination node identifiers associated with each node identifier; and
      (ii) codifying said lists of destination node identifiers into a string;
   and, for a said grouped incoming arcs string, said determining step comprises the steps of:
      (i) determining a list of source node identifiers associated with each node identifier; and
      (ii) codifying said lists of source node identifiers into a string; and
   (d) combining said node string with one or both of said grouped outgoing arcs string and said grouped incoming arcs string to form said canonical form representation of said network.

2. The method of claim 1, wherein said node identifiers are unique for each node.

3. The method of claim 1, wherein said node identifiers are character strings and are ordered in ASCII order.

4. The method of claim 1, wherein said step codifying said grouped outgoing arcs string comprises the steps of:
   codifying, for each node identifier, a node outgoing arcs string from said list of destination node identifiers associated with that particular node identifier; and
   combining said node outgoing arcs strings.

5. The method of claim 1, wherein said step codifying said grouped incoming arcs string comprises the steps of:
   codifying for each node identifier, a node incoming arcs string from said list of source node identifiers associated with that particular node identifier; and
   combining said node incoming arcs strings.

6. The method of claim 4, wherein said node outgoing arcs strings include a first special character.

7. The method of claim 5, wherein said node incoming arcs strings include a second special character.

8. The method of claim 1, wherein said node string is in the following form:
   "$<n_0><n_1><n_2> \ldots <n_{r-1}>$"
   wherein $n_i$ are said node identifiers.

9. The method of claim 4, wherein each of said node outgoing arcs strings is in the following form:
   "$:<n_i><d_{i0}><d_{i1}> \ldots <d_{i,p-1}>$"
   wherein $n_i$ is said particular node identifier, and $d_{ij}$ are said destination node identifiers having said node associated with said particular node identifier $n_i$ as a source node.

10. The method of claim 5, wherein each of said node incoming arcs strings is in the following form:
    "$\%<n_i><s_{i0}><s_{i1}> \ldots <s_{i,q-1}>$"
    wherein $n_i$ is said particular node identifier, and $s_{ik}$ are said source node identifiers having said node associated with said particular node identifier $n_i$ as a destination node.

11. A method of comparing networks, each network having nodes and arcs, each node having a unique identifier, and each arc having a source node and a destination node, said method comprising the steps of:
    representing each network into a canonical form; and
    comparing said canonical forms of said networks, with identical canonical forms signifying identical networks;
    wherein said representing step for each network comprising the steps of:
    (a) ordering a list of said node identifiers;
    (b) creating a node string from said ordered list of node identifiers;
    (c) determining one or both of a grouped outgoing arcs string and a grouped incoming arcs string;
    wherein, for a said grouped outgoing arcs string, said determining step comprises the steps of:
       (i) determining a list of destination node identifiers associated with each node identifier; and
       (ii) codifying said lists of destination node identifiers into a string;
    and, for a said grouped incoming arcs string, said determining step comprises the steps of:
       (i) determining a list of source node identifiers associated with each node identifier; and
       (ii) codifying said lists of source node identifiers into a string; and
    (d) combining said node string with one or both of said grouped outgoing arcs string and said grouped incoming arcs string to form said canonical form representation of said network.

12. The method of claim 11, wherein said step codifying said grouped outgoing arcs string comprises the steps of:
    codifying, for each node identifier, a node outgoing arcs string from said list of destination node identifiers associated with that particular node identifier; and
    combining said node outgoing arcs strings.

13. The method of claim 11, wherein said step codifying said grouped incoming arcs string comprises the steps of:
    codifying for each node identifier, a node incoming arcs string from said list of source node identifiers associated with that particular node identifier; and
    combining said node incoming arcs strings.

14. The method of claim 11, wherein said node string is in the following form:
    "$<n_0><n_1><n_2> \ldots <n_{r-1}>$"
    wherein $n_i$ are said node identifiers.

15. The method of claim 12, wherein each of said node outgoing arcs strings is in the following form:

"$:<n_i><d_{i0}><d_{i1}> \ldots <d_{i,p-1}>$"

wherein $n_i$ is said particular node identifier, and $d_{ij}$ are said destination node identifiers having said node associated with said particular node identifier $n_i$ as a source node.

16. The method of claim 13, wherein each of said node incoming arcs strings is in the following form:

"$\%<n_i><s_{i0}><s_{i1}> \ldots <s_{i,q-1}>$"

wherein $n_i$ is said particular node identifier, and $s_{ik}$ are said source node identifiers having said node associated with said particular node identifier $n_i$ as a destination node.

17. A method of comparing network topologies of networks, each network having nodes and arcs, each node having a node property, and each arc having a source node and a destination node, said method comprising the steps of:

representing each network into a canonical form; and comparing said canonical forms of said networks, with identical canonical forms signifying identical network topologies;

wherein said representing step for each network comprising the steps of:

(a) ordering a list of said node properties;

(b) creating a node property string from said ordered list of node properties;

(c) determining one or both of a grouped outgoing arcs property string and a grouped incoming arcs property string;

wherein, for a said grouped outgoing arcs property string, said determining step comprises the steps of:

(i) determining a list of destination node properties associated with each node; and (ii) codifying said lists of destination node properties into a string;

and, for a said grouped incoming arcs property string, said determining step comprises the steps of:

(i) determining a list of source node properties associated with each node; and (ii) codifying said lists of source node properties into a string; and (d) combining said node property string with one or both of said grouped outgoing arcs property string and said grouped incoming arcs property string to form said canonical form representation of said network.

18. The method of claim 17, wherein said step codifying said grouped outgoing arcs property string comprises the steps of:

codifying, for each node, a node outgoing arcs property string from said list of destination node properties associated with that particular node; and combining said node outgoing arcs property strings.

19. The method of claim 17, wherein said step codifying said grouped incoming arcs property string comprises the steps of:

codifying for each node, a node incoming arcs property string from said list of source node properties associated with that particular node; and combining said node incoming arcs property strings.

20. The method of claim 17, wherein said node property string is in the following form:

"$<\underline{n}_0><\underline{n}_1><\underline{n}_2> \ldots <\underline{n}_{r-1}>$"

wherein $\underline{n}_i$ are said node properties.

21. The method of claim 18, wherein each of said node outgoing arcs property strings is in the following form:

"$:<\underline{n}_i><\underline{d}_{i0}><\underline{d}_{i1}> \ldots <\underline{d}_{i,p-1}>$"

wherein $\underline{n}_i$ is said node property of said particular node $n_i$, and $\underline{d}_{ij}$ are said destination node properties having said particular node $n_i$ as a source node.

22. The method of claim 19, wherein each of said node incoming arcs property strings is in the following form:

"$\%<\underline{n}_i><\underline{s}_{i0}><\underline{s}_{i1}> \ldots <\underline{s}_{i,q-1}>$"

wherein $\underline{n}_i$ is said node property of said particular node $n_i$, and $\underline{s}_{ik}$ are said source node properties having said particular node $n_i$ as a destination node.

23. A network representation for representing a network in a canonical form, said network having nodes and arcs, each node having an identifier, and each arc having a source node and a destination node, said representation comprising:

a node string from an ordered list of said node identifiers;

one or both of a grouped outgoing arcs string and a grouped incoming arcs string, wherein said grouped outgoing arcs string comprises a list of destination node identifiers associated with each node identifier and said incoming arcs string comprises a list of source node identifiers associated with each node identifier.

24. The network representation of claim 23, wherein said node identifiers are unique.

25. The network representation of claim 23, wherein said node identifiers are character strings and are ordered in ASCII order.

26. The network representation of claim 23, wherein said grouped outgoing arcs string comprises:

at least one node outgoing arcs string comprising said list of destination node identifiers associated with each particular node identifier.

27. The network representation of claim 23, wherein said grouped incoming arcs string comprises:

at least one node incoming arcs string comprising said list of source node identifiers associated with each particular node identifier.

28. The network representation of claim 26, wherein said node outgoing arcs strings include a first special character.

29. The network representation of claim 27, wherein said node incoming arcs strings include a second special character.

30. The network representation of claim 23, wherein said node string is in the following form:

"$<n_0><n_1><n_2> \ldots <n_{r-1}>$"

wherein $n_i$ are said node identifiers.

31. The network representation of claim 26 wherein each of said node outgoing arcs strings is in the following form:

"$:<n_i><d_{i0}><d_{i1}> \ldots <d_{i,p-1}>$"

wherein $n_i$ is said particular node identifier, and $d_{ij}$ are said destination node identifiers having said node associated with said particular node identifier $n_i$ as a source node.

32. The network representation of claim 27 wherein each of said node incoming arcs strings is in the following form:

"$\%<n_i><s_{i0}><s_{i1}> \ldots s_{i,q-1}>$"

wherein $n_i$ is said particular node identifier, and $s_{ik}$ are said source node identifiers having said node associated with said particular node identifier $n_i$ as a destination node.

33. Apparatus for representing a network in a canonical form, said network having nodes and arcs, each node having a unique identifier, and each arc having a source node and a destination node, said apparatus comprising:

(a) means for ordering a list of said node identifiers;

(b) means for creating a node string from said ordered list of node identifiers;

(c) means for determining one or both of a grouped outgoing arcs string and a grouped incoming arcs string;

wherein, said means for determining said grouped outgoing arcs string comprises:
(i) means for determining a list of destination node identifiers associated with each node identifier; and
(ii) means for codifying said lists of destination node identifiers into a string;
and, said means for determining said grouped incoming arcs string comprises:
(i) means for determining a list of source node identifiers associated with each node identifier; and
(ii) means for codifying said lists of source node identifiers into a string; and
(d) means for combining said node string with one or both of said grouped outgoing arcs string and said grouped incoming arcs string to form said canonical form representation of said network.

34. The apparatus of claim 33, wherein said means for codifying said grouped outgoing arcs string comprises:
means for codifying, for each node identifier, a node outgoing arcs string from said list of destination node identifiers associated with that particular node identifier; and
means for combining said node outgoing arcs strings.

35. The apparatus of claim 33, wherein said means for codifying said grouped incoming arcs string comprises:
means for codifying for each node identifier, a node incoming arcs string from said list of source node identifiers associated with that particular node identifier; and
means for combining said node incoming arcs strings.

36. The apparatus of claim 33, wherein said node string is in the following form:
"$<n_0><n_1><n_2> \ldots <n_{r-1}>$"
wherein $n_i$ are said node identifiers.

37. The apparatus of claim 34, wherein each of said node outgoing arcs strings is in the following form:
"$:<n_i><d_{i0}><d_{i1}> \ldots <d_{i,p-1}>$"
wherein $n_i$ is said particular node identifier, and $d_{ij}$ are said destination node identifiers having said node associated with said particular node identifier $n_i$ as a source node.

38. The apparatus of claim 35, wherein each of said node incoming arcs strings is in the following form:
"$\%<n_i><s_{i0}><s_{i1}> \ldots <s_{i,q-1}>$"
wherein $n_i$ is said particular node identifier, and $s_{ik}$ are said source node identifiers having said node associated with said particular node identifier $n_i$ as a destination node.

39. An apparatus for comparing networks, each network having nodes and arcs, each node having a unique identifier, and each arc having a source node and a destination node, said apparatus comprising:
means for representing each network into a canonical form; and
means for comparing said canonical forms of said networks, with identical canonical forms signifying identical networks;
wherein said means for representing comprising for each network:
(a) means for ordering a list of said node identifiers;
(b) means for creating a node string from said ordered list of node identifiers;
(c) means for determining one or both of a grouped outgoing arcs string and a grouped incoming arcs string;
wherein, for a said grouped outgoing arcs string, said means for determining comprises:

(i) means for determining a list of destination node identifiers associated with each node identifier; and
(ii) means for codifying said lists of destination node identifiers into a string;
and, for a said grouped incoming arcs string, said means for determining comprises:
(i) means for determining a list of source node identifiers associated with each node identifier; and
(ii) means for codifying said lists of source node identifiers into a string; and
(d) means for combining said node string with one or both of said grouped outgoing arcs string and said grouped incoming arcs string to form said canonical form representation of said network.

40. The apparatus of claim 39, wherein said means for codifying said grouped outgoing arcs string comprises:
means for codifying, for each node identifier, a node outgoing arcs string from said list of destination node identifiers associated with that particular node identifier; and
means for combining said node outgoing arcs strings.

41. The apparatus of claim 39, wherein said means for codifying said grouped incoming arcs string comprises:
codifying for each node identifier, a node incoming arcs string from said list of source node identifiers associated with that particular node identifier; and
combining said node incoming arcs strings.

42. The apparatus of claim 39, wherein said node string is in the following form:
"$<n_0><n_1><n_2> \ldots <n_{r-1}>$"
wherein $n_i$ are said node identifiers.

43. The apparatus of claim 40, wherein each of said node outgoing arcs strings is in the following form:
"$:<n_i><d_{i0}><d_{i1}> \ldots <d_{i,p-1}>$"
wherein $n_i$ is said particular node identifier, and $d_{ij}$ are said destination node identifiers having said node associated with said particular node identifier $n_i$ as a source node.

44. The apparatus of claim 41, wherein each of said node incoming arcs strings is in the following form:
"$\%<n_i><s_{i0}><s_{i1}> \ldots <s_{i,q-1}>$"
wherein $n_i$ is said particular node identifier, and $s_{ik}$ are said source node identifiers having said node associated with said particular node identifier $n_i$ as a destination node.

45. An apparatus for comparing network topologies of networks, each network having nodes and arcs, each node having a node property, and each arc having a source node and a destination node, said apparatus comprising:
means for representing each network into a canonical form; and
means for comparing said canonical forms of said networks, with identical canonical forms signifying identical network topologies;
wherein said means for representing comprising for each network:
(a) means for ordering a list of said node properties;
(b) means for creating a node property string from said ordered list of node properties;
(c) means for determining one or both of a grouped outgoing arcs property string and a grouped incoming arcs property string;
wherein, for a said grouped outgoing arcs property string, said means for determining comprises:
(i) means for determining a list of destination node properties associated with each node; and (ii) means for codifying said lists of destination node properties into a string;

and, for a said grouped incoming arcs property string, said means for determining comprises:

(i) means for determining a list of source node properties associated with each node; and (ii) means for codifying said lists of source node properties into a string; and (d) means for combining said node property string with one or both of said grouped outgoing arcs property string and said grouped incoming arcs property string to form said canonical form representation of said network.

46. The apparatus of claim 45, wherein said means for codifying said grouped outgoing arcs property string comprises:

means for codifying, for each node, a node outgoing arcs property string from said list of destination node properties associated with that particular node; and means for combining said node outgoing arcs property strings.

47. The apparatus of claim 45, wherein said means for codifying said grouped incoming arcs property string comprises:

means for codifying for each node, a node incoming arcs property string from said list of source node properties associated with that particular node; and means for combining said node incoming arcs property strings.

48. The apparatus of claim 45, wherein said node property string is in the following form:

"$<\underline{n}_0><\underline{n}_1><\underline{n}_2> \ldots <\underline{n}_{r-1}>$"

wherein $\underline{n}_i$ are said node properties.

49. The apparatus of claim 46, wherein each of said node outgoing arcs property strings is in the following form:

":$<\underline{n}_i><\underline{d}_{i0}><\underline{d}_{i1}> \ldots <\underline{d}_{i,p-1}>$"

wherein $\underline{n}_i$ is said node property of said particular node $n_i$, and $\underline{d}_{ij}$ are said destination node properties having said particular node $n_i$ as a source node.

50. The apparatus of claim 47, wherein each of said node incoming arcs property strings is in the following form:

"%$<\underline{n}_i><\underline{s}_{i0}><\underline{s}_{i1}> \ldots <\underline{s}_{i,q-1}>$"

wherein $\underline{n}_i$ is said node property of said particular node $n_i$, and $s_{ik}$ are said source properties having said particular node $n_i$ as a destination node.

51. A computer program product carried by a storage medium for representing a network in a canonical form, said network having nodes and arcs, each node having a unique identifier, and each arc having a source node and a destination node, said computer program product comprising:

(a) program element for ordering a list of said node identifiers;

(b) program element for creating a node string from said ordered list of node identifiers;

(c) program element for determining one or both of a grouped outgoing arcs string and a grouped incoming arcs string;

wherein, said program element for determining said grouped outgoing arcs string comprises:

(i) program element for determining a list of destination node identifiers associated with each node identifier; and (ii) program element for codifying said lists of destination node identifiers into a string;

and, said program element for determining said grouped incoming arcs string comprises:

(i) program element for determining a list of source node identifiers associated with each node identifier; and (ii) program element for codifying said lists of source node identifiers into a string; and (d) program element for combining said node string with one or both of said grouped outgoing arcs string and said grouped incoming arcs string to form said canonical form representation of said network.

52. The computer program product of claim 51, wherein said program element for codifying said grouped outgoing arcs string comprises:

program element for codifying, for each node identifier, a node outgoing arcs string from said list of destination node identifiers associated with that particular node identifier; and program element for combining said node outgoing arcs strings.

53. The computer program product of claim 51, wherein said program element for codifying said grouped incoming arcs string comprises:

program element for codifying for each node identifier, a node incoming arcs string from said list of source node identifiers associated with that particular node identifier; and program element for combining said node incoming arcs strings.

54. The computer program product of claim 51, wherein said node string is in the following form:

"$<n_0><n_1><n_2> \ldots <n_{r-1}>$"

wherein $n_i$ are said node identifiers.

55. The computer program product of claim 52, wherein each of said node outgoing arcs strings is in the following form:

":$<n_i><d_{i0}><d_{i1}> \ldots <d_{i,p-1}>$"

wherein $n_i$ is said particular node identifier, and $d_{ij}$ are said destination node identifiers having said node associated with said particular node identifier $n_i$ as a source node.

56. The computer program product of claim 53, wherein each of said node incoming arcs strings is in the following form:

"%$<n_i><s_{i0}><s_{i1}> \ldots <s_{i,q-1}>$"

wherein $n_i$ is said particular node identifier, and $s_{ik}$ are said source node identifiers having said node associated with said particular node identifier $n_i$ as a destination node.

57. A computer program product carried by a storage medium for comparing networks, each network having nodes and arcs, each node having a unique identifier, and each arc having a source node and a destination node, said computer program product comprising:

program element for representing each network into a canonical form; and program element for comparing said canonical forms of said networks, with identical canonical forms signifying identical networks;

wherein said program element for representing comprising for each network:

(a) program element for ordering a list of said node identifiers;

(b) program element for creating a node string from said ordered list of node identifiers;

(c) program element for determining one or both of a grouped outgoing arcs string and a grouped incoming arcs string;

wherein, for a said grouped outgoing arcs string, said program element for determining comprises:

(i) program element for determining a list of destination node identifiers associated with each node identifier; and (ii) program element for codifying said lists of destination node identifiers into a string;

and, for a said grouped incoming arcs string, said program element for determining comprises:

(i) program element for determining a list of source node identifiers associated with each node identifier; and (ii) program element for codifying said lists of source node identifiers into a string; and (d) program element for combining said node string with one or both of said grouped outgoing arcs string and said grouped incoming arcs string to form said canonical form representation of said network.

58. The computer program product of claim 57, wherein said program element for codifying said grouped outgoing arcs string comprises:

program element for codifying, for each node identifier, a node outgoing arcs string from said list of destination node identifiers associated with that particular node identifier; and program element for combining said node outgoing arcs strings.

59. The computer program product of claim 57, wherein said program element for codifying said grouped incoming arcs string comprises:

codifying for each node identifier, a node incoming arcs string from said list of source node identifiers associated with that particular node identifier; and combining said node incoming arcs strings.

60. The computer program product of claim 57, wherein said node string is in the following form:

"$<n_0><n_1><n_2> \ldots <n_{r-1}>$"

wherein $n_i$ are said node identifiers.

61. The computer program product of claim 58, wherein each of said node outgoing arcs strings is in the following form:

"$:<n_i><d_{i0}><d_{i1}> \ldots <d_{i,p-1}>$"

wherein $n_i$ is said particular node identifier, and $d_{ij}$ are said destination node identifiers having said node associated with said particular node identifier $n_i$ as a source node.

62. The computer program product of claim 59, wherein each of said node incoming arcs strings is in the following form:

"$\%<n_i><s_{i0}><s_{i1}> \ldots <s_{i,q-1}>$"

wherein $n_i$ is said particular node identifier, and $s_{ik}$ are said source node identifiers having said node associated with said particular node identifier $n_i$ as a destination node.

63. A computer program product carried by a storage medium for comparing network topologies of networks, each network having nodes and arcs, each node having a node property, and each arc having a source node and a destination node, said computer program product comprising:

program element for representing each network into a canonical form; and program element for comparing said canonical forms of said networks, with identical canonical forms signifying identical network topologies;

wherein said program element for representing comprising for each network:

(a) program element for ordering a list of said node properties;

(b) program element for creating a node property string from said ordered list of node properties;

(c) program element for determining one or both of a grouped outgoing arcs property string and a grouped incoming arcs property string;

wherein, for a said grouped outgoing arcs property string, said program element for determining comprises:

(i) program element for determining a list of destination node properties associated with each node; and (ii) program element for codifying said lists of destination node properties into a string;

and, for a said grouped incoming arcs property string, said program element for determining comprises:

(i) program element for determining a list of source node properties associated with each node; and (ii) program element for codifying said lists of source node properties into a string; and (d) program element for combining said node property string with one or both of said grouped outgoing arcs property string and said grouped incoming arcs property string to form said canonical form representation of said network.

64. The computer program product of claim 63, wherein said program element for codifying said grouped outgoing arcs property string comprises:

program element for codifying, for each node, a node outgoing arcs property string from said list of destination node properties associated with that particular node; and program element for combining said node outgoing arcs property strings.

65. The computer program product of claim 63, wherein said program element for codifying said grouped incoming arcs property string comprises:

program element for codifying for each node, a node incoming arcs property string from said list of source node properties associated with that particular node; and program element for combining said node incoming arcs property strings.

66. The computer program product of claim 63, wherein said node property string is in the following form:

"$<\underline{n}_0><\underline{n}_1><\underline{n}_2> \ldots <\underline{n}_{r-1}>$"

wherein $\underline{n}_i$ are said node properties.

67. The computer program product of claim 64, wherein each of said node outgoing arcs property strings is in the following form:

"$:<\underline{n}_i><\underline{d}_{i0}><\underline{d}_{i1}> \ldots <\underline{d}_{i,p-1}>$"

wherein $\underline{n}_i$ is said node property of said particular node $n_i$, and $\underline{d}_{ij}$ are said destination node properties having said particular node $n_i$ as a source node.

68. The computer program product of claim 65, wherein each of said node incoming arcs property strings is in the following form:

"$\%<\underline{n}_i><\underline{s}_{i0}><\underline{s}_{i1}> \ldots <\underline{s}_{i,q-1}>$"

wherein $\underline{n}_1$ is said node property of said particular node $n_i$, and $\underline{s}_{ik}$ are said source node properties having said particular node $n_i$ as a destination node.

* * * * *